United States Patent

Black et al.

[15] 3,648,061

[45] Mar. 7, 1972

[54] ALL TRANSISTOR LOGIC EMPLOYING TRANSISTORS OF A SINGLE-CONDUCTIVITY-TYPE

[72] Inventors: John C. Black, Endwell; Frederick Buckley, Endicott, both of N.Y.

[73] Assignee: International Business Machines Corporation, Armonk, N.Y.

[22] Filed: May 19, 1970

[21] Appl. No.: 38,742

[52] U.S. Cl. ..............................307/218, 307/213, 307/215, 307/242

[51] Int. Cl. ..............................H03k 19/22

[58] Field of Search..................307/218, 215, 242, 213, 289

[56] References Cited

UNITED STATES PATENTS

| | | | |
|---|---|---|---|
| 3,281,651 | 10/1966 | Contino | 307/242 |
| 3,544,994 | 12/1970 | Hanson | 307/242 |
| 3,532,909 | 10/1970 | Buckley | 307/213 |
| 3,467,839 | 9/1969 | Miller | 307/289 |

*Primary Examiner*—John S. Heyman
*Assistant Examiner*—David M. Carter
*Attorney*—Hanifin and Jancin

[57] ABSTRACT

A logic element fabricated entirely of transistors of a single-conductivity-type and having logic states represented by two ranges of current levels. The transistors are operated in their linear regions and have reference currents passing therethrough for establishing the operating current levels of the logic element.

A logic element has one or more current inputs as well as one or more current outputs. Each of the input currents is at or below a predetermined level. The adjustment of the reference currents in the system make it possible for the logic element to perform several Boolean functions depending upon the operating level. The logic elements can be operated with a reference current such that the logic element will perform the logic "OR" function. In addition, the reference current may be adjusted such that either a majority logic function or an "AND" function may also be performed.

9 Claims, 9 Drawing Figures

Patented March 7, 1972 3,648,061
2 Sheets-Sheet 1
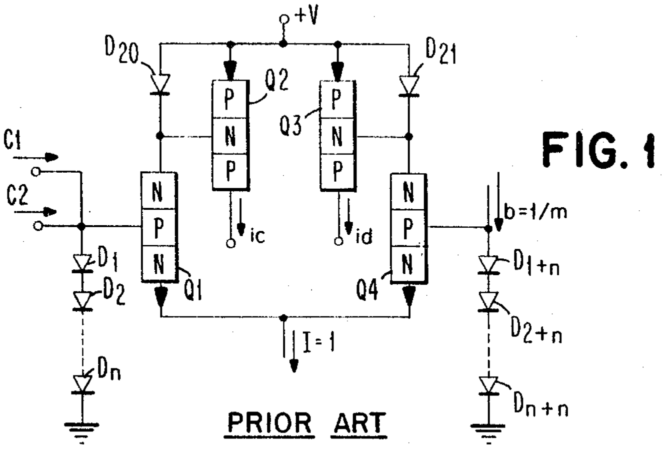
FIG. 1
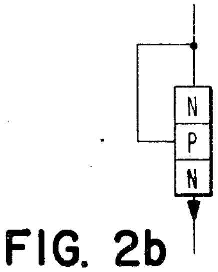
FIG. 2b
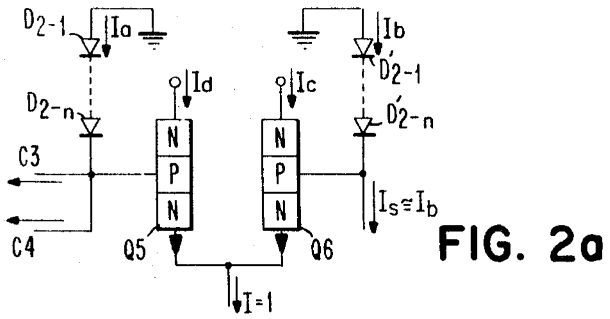
FIG. 2a
| C3 | C4 | Ia |
|---|---|---|
| 0 | 0 | 0 |
| 0 | 1 | 1 |
| 1 | 0 | 1 |
| 1 | 1 | 1 |
FIG. 3a
| C | C | Ib |
|---|---|---|
| 0 | 0 | 1 |
| 0 | 1 | 0 |
| 1 | 0 | 0 |
| 1 | 1 | 0 |
FIG. 3b
| C3 | C4 | Ic |
|---|---|---|
| 0 | 0 | 0 |
| 0 | 1 | 0 |
| 1 | 0 | 0 |
| 1 | 1 | 1 |
FIG. 3c
INVENTORS
JOHN C. BLACK
FREDERICK BUCKLEY
BY John D. Crane
AGENT

ALL TRANSISTOR LOGIC EMPLOYING TRANSISTORS OF A SINGLE-CONDUCTIVITY-TYPE

BACKGROUND OF THE INVENTION

1. Field of the Invention

The present improved logic element is used in any electrical apparatus wherein logical signals are represented as current levels. The improved logic element of this invention can be fabricated entirely of transistor elements having a single-conductivity type. Further, the logic element of a single-conductivity type may be preceded and succeeded by logic elements of the same conductivity type. The only potential need for resistors in logic elements described by the present invention is in the bias or reference current sources. Because the active elements of the present invention use only single-conductivity type transistors, it is possible to fabricate logic elements of this type in a single manufacturing process which achieves the additional benefit of having transistor elements with highly matched characteristics.

2. Description of the Prior Art

The improved logic element of the present application makes use of the teachings of copending U.S. Pat. application, Ser. No. 698,566 of Frederick Buckley, filed Jan. 17, 1968 and entitled, "Transistor Logic Scheme with Current Logic Levels Adapted for Monolithic Fabrication"; and said copending application is hereby incorporated by reference. That copending application teaches and claims the use of transistors having matched base-emitter characteristics with their base and collector electrode shorted together to form a two port network used as a diode. Additionally, the logic elements there described employ transistors which have similar base-emitter characteristics to those of the other transistors of the same conductivity type. The logic elements of the aforementioned copending application use the transistors and diodes as interconnected to form logical elements. Those logical elements in addition require the use of transistors having two different polarity types in order to achieve the desired output logical function. Alternately, if one logic element is fabricated of a single first-conductivity type, the succeeding element in series must be of a second-conductivity type. These limitations are due to the fact that in the prior art, the voltage applied to the base of the input transistors is effectively applied across the base-to-emitter junction of the input transistors. Such a configuration requires translation transistors either of the second-conductivity type or the output current require the succeeding logic element to be of the second-conductivity type. This requirement of transistors of two conductivity types in the implementation of logic devices poses significant fabrication problems.

The logic block of the present invention employs transistors of only a single-conductivity type for implementing logic functions which heretofore had been impossible without the use of transistors of diverse conductivity types.

SUMMARY OF THE INVENTION

It is a primary object of the present invention to provide an improved logic element employing transistors of a single-conductivity type which respond to input currents at one or another of two predetermined ranges of current level to produce an output current at one or the other of the predetermined current levels. It is another object of the present invention to provide an improved logic element employing transistors of a single-conductivity type suitable for direct connection in series to succeeding logic elements employing transistors of the same conductivity type as that of the preceding logic element.

It is another object of the present invention to provide an improved logic element which is particularly adapted to high-speed monolithic fabrication techniques.

It is a further object of the present invention to provide a logic block capable of performing different Boolean functions, the different Boolean functions being controlled by a reference current.

The operation of this improved logic element is such that one to $n$ input currents at or below a lower current level operate the logic element so as to be in a first logical state, and one or more input currents at or above an upper current level operate the logic elements in a second logical state.

The current transfer function above described is accomplished by providing two groups of transistors wherein all the emitter electrodes of such transistors are connected in common to a first current source. The base electrodes in each group are connected together to a plurality of series-connected diodes or transistors with their base-collector electrodes short circuited. These series-connected diodes or transistors are connected to a reference so as to effect the collector-to-base voltage of the two groups of transistors. For stability of operation, the voltage-current characteristics of the devices in each of the groups of transistors and diode-connected transistors should be substantially matched with those of the other group. A second current source is also provided, the magnitude of said second source being predetermined and adjusted in such a manner as to determine the Boolean function to be performed by the logic element. The second current source is connected to one of the series-connected plurality of diodes so as to establish a predetermined collector-to-base voltage level at the base electrodes of one of the transistor groups. The other group of transistors forms the input node for the logic element and has input currents coupled thereto.

With the diode-connected transistors effectively connected across the collector-to-base junction of the two groups of transistors, the current outputs are suitable for series connection to a succeeding logic element of the same conductivity type without the requirement of translation transistors. The transistor arrangement of the present invention allows complementary output currents to occur at the different collector electrodes of the transistors in the two groups when operated as an OR element. The logical relationship for the OR element between the outputs at the different groups of collectors is that a collector in one group always has the inverse logical value of a collector in the other group.

The foregoing and other objects, features, and advantages of the invention will be apparent from the following more particular description of the preferred embodiments of the invention, as illustrated in the accompanying drawings.

BRIEF DESCRIPTION OF THE DRAWINGS

FIG. 1 illustrates a circuit configuration previously known.

FIG. 2*a* shows the greatly simplified circuit configuration of the present invention.

FIG. 2*b* shows a diode fabricated by shorting the collector-base junction.

FIGS. 3*a*, 3*b* and 3*c* describe the logical operation of the circuitry of FIG. 2.

DETAILED DESCRIPTION

Figure 4:
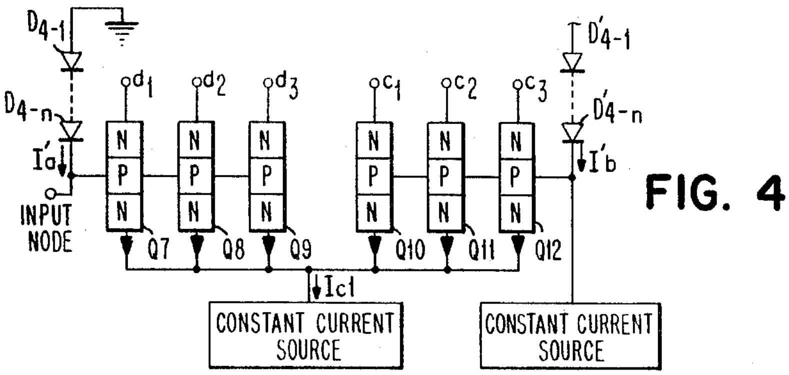
FIG. 4 shows the circuitry employing the present invention with a greater fan out capability than that of the circuit of FIG. 2.

FIG. 1 shows a circuit diagram which corresponds to the prior art embodiment of a logic block having characteristics somewhat similar to that of the present invention. The detailed description of the operation of the circuit shown in FIG. 1 of the referenced application is helpful to the understanding of this invention. It is important to note, however, that the circuitry shown in FIG. 1 requires the use of transistors of two different conductivity types. Such a requirement does not readily adapt itself to monolithic fabrication techniques as it is necessary to use different processes to create the necessary conductivity type transistors. This limitation is a result of connecting diodes $D_l$ to $D_n$ and $D_{l+n}$ to $D_{1+n}$ across the base-to-emitter junction of the two transistors $Q_1$ and $Q_4$, respectively. In addition, the circuitry of FIG. 1 requires fewer transistor elements to perform the same logical operations performable by the circuitry of FIG. 2*a*.

Referring now to FIG. 2*a*, a simplified logic element is shown which employs two transistor elements Q5 and Q5 each being of the same conductivity type, namely, an NPN-type as shown. The emitters of transistors Q5 and Q6 are connected together and are shown to have a current I equaling one passing through the combined emitters of these two transistors. The magnitude of the current I is a relative one and is defined to have a magnitude of one while the other currents in the logic element shown in FIG. 2*a* must be adjusted to other magnitudes so as to create the proper biasing of the logic element. The base circuit of transistor Q5 is shown connected to a plurality of series-connected diodes $D_{2-l}$ through $D_{2-n}$. The drawing indicates that there are n diodes, where n is a positive integer, connected in series between a ground reference point and the base electrode of transistor Q5. Diodes $D_{2-l}$ to $D_{2-n}$ are returned to a reference point which imparts these developed across them to the collector-to-base junction of transistor Q5. The series diode element in the preferred embodiment of the present invention are manufactured out of transistor elements wherein the base and collector electrodes of a transistor are shorted together to create a device having diode characteristics. Such a diode connected transistor is shown in FIG. 2*b*.

The base electrode of transistor Q5 is also connected ton input terminals $C_3$ and $C_4$. These input terminals represent connections to other logic elements in a system employing logic elements of the type shown in FIG. 2*a*. A current flowing through input node $C_3$ or $C_4$ in the direction of arrow as shown is said to have a logical value of 1 when the current is of a magnitude substantially equal to I in the common emitter circuit of transistors Q5 and Q6. When either of the currents passing through input nodes $C_3$ or $C_4$ is very small compared to I, then that current is said to have a logical value of zero.

The base of transistor Q6 is a control node connected to *n* (*n* being a positive integer) series-connected diodes between a ground reference point and the base electrode. The base circuit of transistor Q6 is also connected to a constant current source which draws a current $I_s$ from the junction point of the base of transistor Q6 and the end of the *n* series-connected diodes. The current flowing through the *n* series-connected diodes is $I_b$. $I_s$ is approximately equal to $I_b$.

The constant current sources required to produce the currents I and $I_s$ can readily be manufactured by the use of only NPN type transistors which facilitate the manufacturing process of the present invention. Such a current source can take the form as described by R. Ordower in U.S. Pat. No. 3,392,342.

The circuitry shown in FIG. 2*a*, with the proper selection of the current $I_s$, can be made to operate as a logic element with the logical characteristics described by the Boolean expressions represented in FIGS. 3*a* and 3*b*. FIG. 3*a* describes the operation of the logic element as being that of the classical OR circuit. When the input terminals $C_3$ and $C_4$ have currents at zero state passing therethrough, the output at the collector of transistor Q6 has a logical state also of zero. When either or both of the input terminals $C_3$ or $C_4$ have a current representing a one state passing therethrough, the current flowing in the collector of Q6 is defined as having a logical state of one.

The logical expressions represented by FIG. 3*b* show that when the circuit of FIG. 2*a* is employed and the collector of transistor Q5 is used as an output, the OR-INVERT function is achieved.

Figure 6:
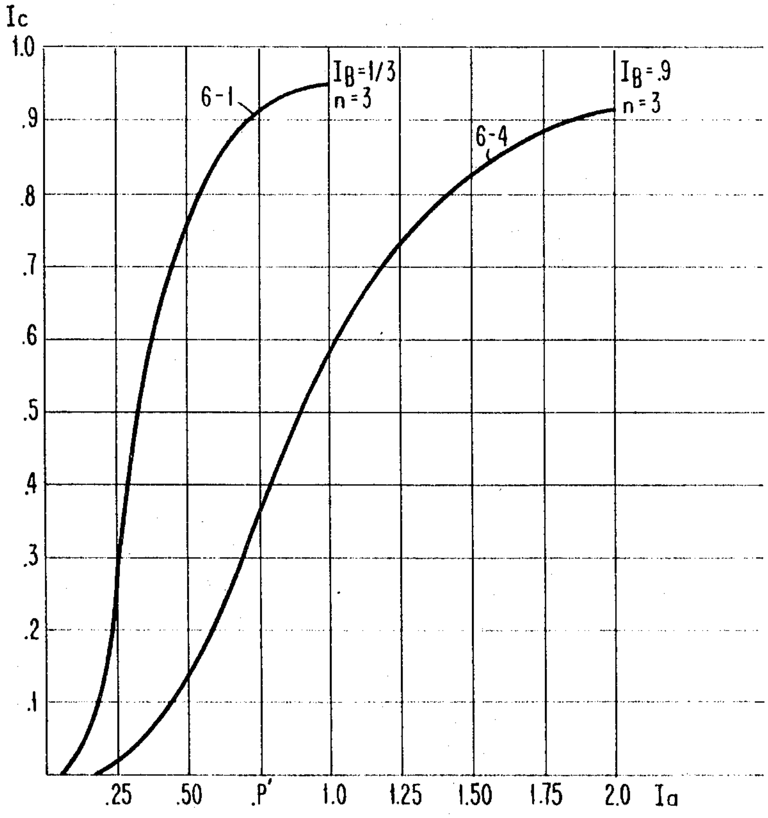
FIG. 6 illustrates the logical operation of the logic element of the present invention.

In order to arrive at the circuit capable of performing logical functions as described in FIGS. 3*a* and 3*b*, various parameters of the network described by FIG. 2*a* must be determined. The equation $$I_c/I_d=[I_d/I_b]^n$$

defined the mode of operation of the circuit in FIG. 2*a*. *Curve* 6–1 of FIG. 6 shows a plotting of the above equation where $I_b$=⅓ and *n* equals 3. Analysis has shown that the network of FIG. 2*a* employing the above defined numbers will yield a logic element having the logical characteristics expressed by FIGS. 3*a* and 3*b*.

The logical expression of FIGS. 3*a* and 3*b* can be confirmed through a simple analysis of the operation of the elements shown in FIG. 2*a*. It is clear that as increased currents flow in the input terminals $C_3$ and $C_4$, the voltage at the base of transistor Q5 must become more negative due to the voltage drop across the series-connected diodes. This voltage drop will tend to turn transistor Q5 off and thus cause the current $I_d$ to decrease. Through proper selection of *n* and $I_b$, it is possible that when the input current state through input terminal $C_3$ or $C_4$ is a one, that the current flowing in the collector of transistor Q5 is defined as having a zero state. Thus, this simple analysis confirms that the circuit performs in accordance with the Boolean expressions represented in FIG. 3*b*.

At the same time the current increases in input terminals $C_3$ or $C_4$ causing a resultant drop in the current $I_d$, $I_c$ must increase in order that the net current flowing in the emitters of transistors Q5 and Q6 remains 1. Thus, a decrease in the current $I_d$ must cause an increase in the current $I_c$, this action showing that the Boolean expressions of FIG. 3*a* are also correct.

It will be recognized by those of skill in the art that the above operation can be duplicated through the use of various possible numbers for *n* and $I_b$. By choosing different values of *n* and $I_b$, the shape of the curve 6–1 of FIG. 6 is changed. Some of the different curves have better shapes than others for use as logic elements. Where *n* is 3 and $I_b$=⅓, the curve looks like 6–1 of FIG. 6. A one level current at an input port $C_3$ or $C_4$ actually must take on a value of approximately 0.96*I* for a circuit like FIG. 2*a*. A zero level input at an input port takes on a value of 0.04*I*. Using an accurate plot of curve 6–1 in FIG. 6 it can be shown that the table of FIG. 3*a* would look like the table below

| $C_3$ | $C_4$ | $I_c$ |
|---|---|---|
| 0.04 | 0.04 | 0.01 |
| 0.04 | 0.96 | 0.97 |
| 0.96 | 0.04 | 0.97 |
| 0.96 | 0.96 | 0.99 |

The advantage of the selected values for *n* and $I_b$ is that if two zero-value currents appear at the input to be a logic network, the output is in magnitude smaller than either input and thus is a valid logical zero also. A similar relationship occurs for one value inputs. Thus a one or zero input at any one logic element will not cause a change in logic level when a string of logic elements are connected together. This favorable relationship occurs for other values of $I_b$ and *n*.

The circuitry of FIG. 2*a* can be made to perform in accordance with the Boolean equations represented in FIG. 3*c*. Since the equation of operation for the circuitry of FIG. 2*a* is defined by the equation $$I_d/I_c=[I_d/I_b]^n$$

By modifying $I_b$ and n in the circuit configuration of FIG. 2*a*, the desired results can be achieved. In FIG. 6 the above equation is plotted on line 6–4 where it is assumed that *n*=3 and $I_b$= 0.9 and $I_c+I_d$=1. This particular curve would appear to represent an operating point which would produce the desired Boolean characteristics as described in FIG. 3*a* although there are many other values which can be selected for the various parameters in the above equation to net similar results. It is also clear that other values might be selected which result in an operation wherein the circuitry of FIG. 2*a* would perform the Boolean functions of FIG. 3*c*. The selection of the various parameters for the network is normally an optimizing one where the parameters are selected so as to produce the desired logical effects as well as improve the fan in and fan out capabilities of circuits. Those of skill in the art will readily be able to alter the parameters of the circuit shown in FIG. 2a and achieve either the Boolean expressions of FIGS. 3a and 3b or the expressions of FIG. 3c.

It should further be noted that FIG. 2a might have additional input terminals, in parallel with $C_3$ and $C_4$, which are not shown in the drawing. The incorporation of such additional input terminals would have no effect upon the operation if the circuit performed the functions as suggested by the Boolean equations of FIGS. 3a and 3b. Under such a situation, if any one of a plurality of input terminals has a current passing therethrough representing the binary one state, the output current $I_c$ becomes activated. In the case of the circuit operation so as to perform the Boolean functions described in FIG. 3c, an additional input to the circuit might yield several different possible results depending upon the selection of $I_b$ and $n$. It is possible that such a circuit will operate "majority logic" elements. That is, if any two input terminals have currents passing therethrough representing a binary one state, the output current $I_c$ would be activated. By changing the parameters, it would also be possible to create a classical three-input AND-functional block wherein a logical one current must pass through all three input terminals to cause a logical one current to occur in the collector of Q6 in FIG. 2a.

FIG. 4 shows a modification of the circuitry shown in FIG. 2a to achieve a greater fan out capability. Since currents from a given output collector have predetermined logical values, each output collector such as $C_1$, $C_2$ or $C_3$ in FIG. 4 can be connected to an input node of another logic circuit. If more than one input node is connected to a given collector, the current flowing in each input node is half that flowing in the collector circuit as the currents must divide between the two input nodes. Thus, the logical state represented by the current flowing in the two input nodes can be different from that of the logical state of current flowing in the collector. As a consequence it is a general rule of circuitry of the type shown in the preferred embodiments of this invention that each collector such as $C_1$, $C_2$ or $C_3$ is connected to only one input node in another logical network. The fan out capability of circuits of the type shown in FIG. 3 is achieved through the parallel connection of many transistors such as Q10, Q11 and Q12.

In FIG. 4 the first plurality of transistors Q10, Q11 and Q12 have the same function as does Q6 in FIG. 2a. The second plurality of transistors Q7, Q8 and Q9 perform the same functions as does Q5 in FIG. 2a. The current $I_{ct}$ in FIG. 4 is adjusted to a value equal to three such that there will be enough current flowing in the common emitter circuits of the transistors shown in FIG. 4 to allow the conducting transistors to have a logical one state current in their respective collectors and also allow a logical zero state current to exist in the collectors of the nonconducting transistors.

Figure 5:
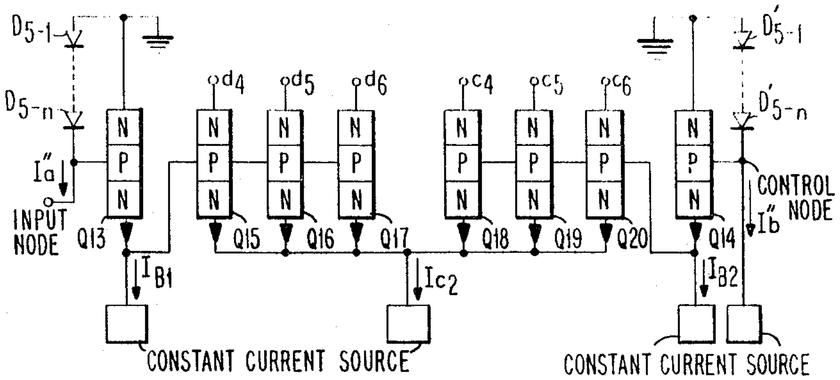
FIG. 5 shows a circuit having improved performance over that of FIG. 4.

FIG. 5 shows an improved version of the circuitry shown in FIG. 4. The principal difference between the two circuits is the addition of transistors Q13 and Q14. Transistors Q13 and Q14 improve the operation of the logical circuit shown in FIG. 5 because there is an isolation factor between the input node and transistors Q15, Q16 and Q17. Transistor Q13 reduces the effect of the base currents of the transistors Q15, Q16 and Q17. Likewise, transistor Q14 reduces the effect of the base currents of transistors Q18, Q19 and Q20.

It should be noted that the various transistors shown in the preferred embodiments of the present invention are operated in their linear regions in order to achieve the desired current relationships described above. It will also be recognized that the present invention could be practiced through the use of PNP transistors rather than, as has been shown, NPN transistors. It must further be noted that those of skill in the art will readily recognize that the changing of the various numbers of diodes and the values of the various currents heretofore defined make it possible to change the characteristics of the logic element herein described and that any selection of the variable elements that yields a logical result like that described above is within the scope of this invention even though the specific numbers of elements and current values have not been specifically mentioned.

While the invention has been particularly shown and described with reference to preferred embodiments thereof, it will be understood by those skilled in the art that the foregoing and other changes in form and details may be made therein without departing from the spirit and scope of this invention.

What is claimed is:

1. A logic element employing transistors of only a single-conductivity type comprising:
 a first reference point having a first potential level;
 a second reference point having a second potential level;
 a first and second plurality of transistors,
  each transistor having a base, emitter and collector,
  the emitters of each of said first and second plurality of transistors being connected together and tied to said first reference point by way of a first current source,
  each of the collectors of said first plurality of transistors comprising an output node and each of the collectors of said second plurality of transistors comprising a complement output node, means connecting each of the bases of said first plurality of transistors together to comprise an input node;
 a series circuit comprising a third plurality of transistors,
  each of said third plurality of transistors having a base, emitter and collector and further having the base electrically shorted to the collector,
  means connecting said third plurality of transistors in series circuit between said second reference point and said input node;
 means connecting each of the bases of said second plurality of transistors together to form a control node,
  said control node being tied to said first reference point by way of a second current source; and
 a fourth plurality of transistors,
  each of said fourth plurality of transistors having a base, emitter and collector and further having the base electrically shorted to the collector;
  means connecting said fourth plurality of transistors in series circuit between said second reference point and said control node.

2. A logic element employing transistors of only a single-conductivity type comprising:
 a first reference point having a first potential level;
 a second reference point having a second potential level;
 a first and second transistor,
  each transistor having a base, emitter and collector,
  the emitters of said first and second transistors being connected together and tied to said first reference point by way of a first current source, whereby,
  the collector of said first transistor comprises an output node,
  the collector of said second transistor comprises a complement output node,
  the base of said first transistor comprises an input node, and
  the base of said second transistor comprises a control node;
 means connecting said control node to said first reference point by way of a second current source;
 a first plurality of transistors,
  each of said first plurality of transistors having a base, emitter and collector and further having the base electrically shorted to the collector,
  each of said first plurality of transistors being series-connected between said second reference point and said input node;
 a series circuit comprising a second plurality of transistors,
  each of said second plurality of transistors having a base, emitter and collector and further having the base electrically shorted to the collector,
  means connecting said second plurality of transistors in series circuit between said second reference point and said control node.

3. A logic element employing transistors of only a single-conductivity type comprising:

a first reference point having a first potential level;

a second reference point having a second potential level;

a first and second plurality of transistors, each transistor having a base, emitter and collector, the emitters of each of said first and second plurality of transistors being connected together and tied to said first reference point by way of a first current source, said first current source acting to pass a current having a defined binary value of one through each of the emitters in one plurality of said first or second plurality of transistors and acting to pass a current having a defined binary value of zero through the other plurality of said first or second plurality of transistors;

each of the collectors of said first plurality of transistors comprising an output node and each of the collectors of said second plurality of transistors comprises a complement output node, an input node comprising a common connection to each of the bases of said first plurality of transistors;

means connecting each of the bases of said second plurality of transistors together to form a control node;

means connecting said control node to said first reference point by way of a second current source having a current magnitude of approximately $1/n$ times the magnitude of the first current source;

a series circuit comprising a third plurality of transistors having $n$ transistors where $n$ is a positive integer, each of said third plurality of transistors having a base, emitter and collector and further having the base electrically shorted to the collector, means connecting said third plurality of transistors in series circuit between said second reference point and said input node.

4. A logic element employing transistors of only a single-conductivity type comprising:

a first reference point having a first potential level;

a second reference point having a second potential level;

a first and second transistor, each transistor having a base, emitter and collector, the emitters of said first and second transistors being connected together and tied to said first reference point by way of a first current source, said first current source acting to pass a current having a defined binary value of one through either the emitter of said first or said second transistor;

whereby the collector of said first transistor comprises an output node, the collector of said second transistor comprises a complement output node, the base of said first transistor comprises an input node, and the base of said second transistor comprises a control node;

means connecting said control node to said first reference point by way of a second current source;

a series circuit comprising a first plurality of transistors comprising $n$ transistors where $n$ is a positive integer, each of said first plurality of transistors having a base, emitter and collector and further having the base electrically shorted to the collector;

means connecting said third plurality of transistors in series circuit between said second reference point and said input node;

a series circuit comprising a second plurality of transistors comprising $n$ transistors, each of said second plurality of transistors having a base, emitter and collector and further having the base electrically shorted to the collector;

means connecting said second plurality of transistors in series circuit between said second reference point and said control node.

5. The logic element of claim 4 wherein said second current source has a current amplitude of substantially $1/n$ times the magnitude of said first current source.

6. A logic element employing transistors of only a single-conductivity type comprising:

a first reference point having a first potential level;

a second reference point having a second potential level;

a first and second plurality of transistors, each plurality of transistors comprising $n$ transistors where $n$ is a positive integer greater than one, each transistor having a base, emitter and collector, the emitter of each of said first and second plurality of transistors being connected together and tied to said first reference point by way of a first current source, said first current source acting to pass a current having a defined binary value of one through each of the emitters in one plurality of said first and said second plurality of transistors and acting to pass a current having a defined binary value of zero through the other plurality of said first and second plurality of transistors;

each of the collectors of said first plurality of transistors comprising an output node and each of the collectors of each second plurality of transistors comprising a complement output node;

means connecting each of the bases of said first plurality of transistors together to comprise an input node;

means connecting the base of said second plurality of transistors together to form a control node;

means connecting said control node to said first reference point by way of a second current source;

a third plurality of transistors, each of said third plurality of transistors having a base, emitter and collector and further having the base electrically shorted to the collector;

means connecting each of said third plurality of transistors in series circuit between said second reference point and said input node; and a fourth plurality of transistors, each of said fourth plurality of transistors having a base, emitter and collector and further having the base electrically shorted to the collector;

means connecting each of said fourth plurality of transistors in series circuit between said second reference point and said control node.

7. The logic element in claim 6 wherein said third and fourth plurality of transistors comprise $n$ transistors where $n$ is a positive integer greater than one.

8. The logic element of claim 7 wherein said second current source has a current amplitude of substantially $1/n$ times the magnitude of said first current source.

9. A logic element employing transistors of only a single conductivity type comprising:

a first reference point having a first potential level;

a second reference point having a second potential level;

a first and second plurality of transistors, each transistor having a base, emitter and collector, the emitters of each of said first and second plurality of transistors being connected together and tied to said first reference point by way of a first current source, each of the collectors of said first plurality of transistors comprising an output node and each of the collectors of said second plurality of transistors comprising a complement output node, means connecting each of the bases of said first plurality of transistors together to comprise an input node;

a series circuit comprising a third plurality of transistors, each of said third plurality of transistors having a base, emitter and collector and further having the base electrically shorted to the collector, means connecting said third plurality of transistors in series circuit between said second reference point and said input node;

means connecting each of the bases of said second plurality of transistors together to form a control node, said control node being tied to said first reference point by way of a second current source having a current value which is a predetermined fraction of that of the first current source; and a fourth plurality of transistors, each of said fourth plurality of transistors having a base, emitter and collector and further having the base electrically shorted to the collector, the composite base-emitter voltage-current characteristic of the fourth plurality of transistors substantially matching that of the third plurality of transistors;

means connecting said fourth plurality of transistors in series circuit between said second reference point and said control node.

* * * * *